United States Patent [19]
Barkley et al.

[11] Patent Number: 4,687,907
[45] Date of Patent: Aug. 18, 1987

[54] HEATER DEVICE

[75] Inventors: Vincent P. Barkley, Arlington, Va.; William J. Siegel, Silver Spring, Md.

[73] Assignee: PACE, Incorporated, Laurel, Md.

[21] Appl. No.: 742,702

[22] Filed: Jun. 7, 1985

[51] Int. Cl.[4] .............................................. F24H 3/06
[52] U.S. Cl. .................................... 219/373; 219/302; 228/242
[58] Field of Search ................ 219/230, 302, 305, 368, 219/373; 228/240, 242; 156/497

[56] References Cited

U.S. PATENT DOCUMENTS

| | | | |
|---|---|---|---|
| 2,828,359 | 3/1959 | Schreiner | 219/373 |
| 3,718,805 | 2/1973 | Posey | 219/373 |
| 3,782,456 | 1/1974 | Gusmer | 219/302 |
| 4,177,375 | 12/1979 | Meixner | 219/302 |
| 4,426,571 | 1/1984 | Beck | 228/242 |
| 4,508,957 | 4/1985 | Rocchitelli | 219/305 |

FOREIGN PATENT DOCUMENTS 370687  4/1932  United Kingdom ................ 219/305

Primary Examiner—John Sipos
Attorney, Agent, or Firm—Gerald J. Ferguson, Jr.; Michael P. Hoffman; Ronni S. Malamud

[57] ABSTRACT

Heater device suitable for heating a fluid such as air to be contacted with a plurality of terminals of a modular electronic component to facilitate attachment of the component to a printed circuit board or removal therefrom. The device comprises two heat exchange elements having a stainless steel etched foil heater sandwiched therebetween. Each heat exchange element is approximately square in configuration, and has a passageway extending from an outer peripheral point of each element about a central axis parallel to the four sides of each element toward the center. The heat exchange elements may be connected for serial flow whereby air to be heated passes along the passageway of one element and then enters the second heat exchange element and passes through that element and exits therefrom, or for parallel flow whereby a first stream of air to be heated passes through one of the elements and a second stream of air to be heated passes through the second heat exchange element. In a preferred embodiment, the heated device has two plenums one adjacent to each heat exchange element so that air contained in each plenum is at least partially heated by the associated heat exchange element. In addition, the air in each plenum at least partially insulates the heat exchange elements from the exterior of the device, thereby preventing undue increase in temperature in the immediate vicinity of the device.

14 Claims, 10 Drawing Figures

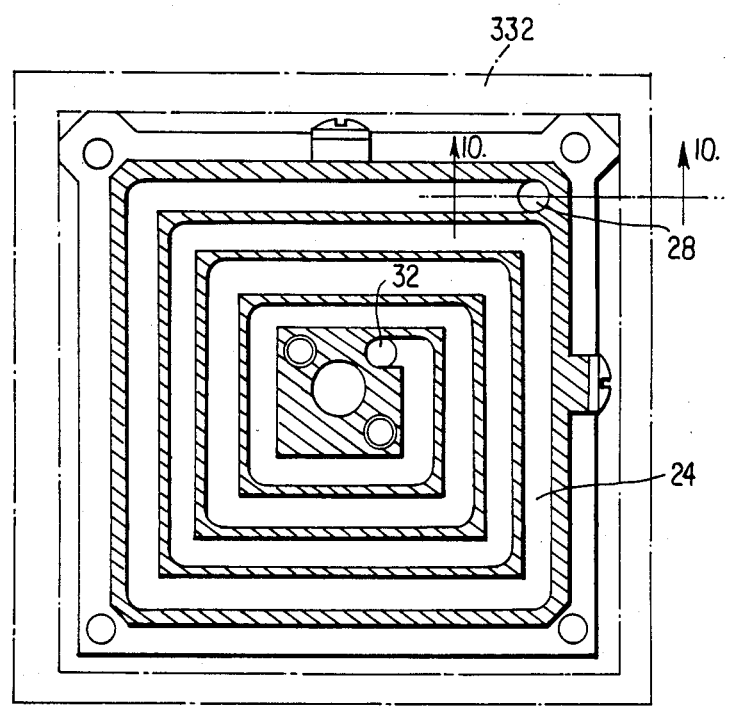
FIG. 3
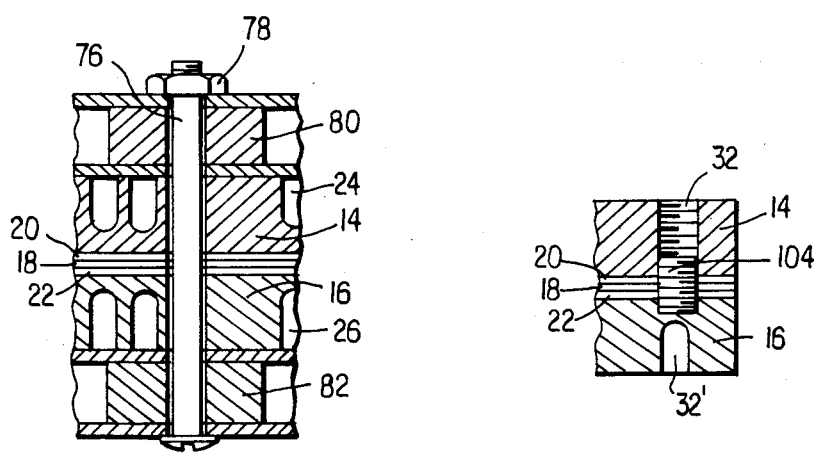
FIG. 5
FIG. 10

HEATER DEVICE

The present invention relates to heating apparatus, and more particularly to a heating device suitable for use in conjunction with an apparatus for attaching modular electronic components to or removing them from a substrate such as a printed circuit board.

BACKGROUND OF THE INVENTION

Devices suitable for use in removing or installing modular electronic components from a substrate such as a printed circuit board generally fall into two categories, namely those which use a heated head which contacts each terminal to melt the solder, and those which use a blast of hot air to melt the solder. The former devices are generally very complex and employ a heated head having a plurality of spaced-apart fingers each of which must be separately aligned with each terminal around the component to simultaneously heat the solder. The component is then withdrawn from the substrate by vacuum suction or other suitable mechanical means. The procedure is reversed for installing a component. The latter devices direct a blast of hot air at the terminals from a source above the component to simultaneously melt the solder on each of the terminals. Examples of such devices are disclosed in U.S. Pat. Nos. 4,295,596 and 4,366,925. The devices in each of those two patents operate by directing a blast of hot air onto the terminals of a component, followed by removal of the component either mechanically or by the application of suction.

A disadvantage associated with the prior devices is that the heating source for the air is remote from the point at which the hot air is directed towards the terminals of a component, and as a result signigicant variations in temperature of the air are observed when the heater is turned on and air flows through the device (the "run" time) and when the heater is turned off (the "idle" time ) when air in the apparatus is permitted to cool down. As a result of this, when the heater is again switched on there is a lag time during which the air is again raised to the solder melting temperature and this results in increased energy consumption and time delay.

It is therefore a primary object of the present invention to provide an improved heating device suitable for use in the installation and removal of electronic components from circuits printed on a substrate.

It is another object of the present invention to provide a heating device which employs heat exchange elements for heating fluid, typically air, immediately prior to directing the heated air towards the terminals of the component on the substrate.

It is yet another object of the present invention to provide a heating device wherein a plenum is provided immediately adjacent the heat exchange elements, so that air present in each plenum is at least partially heated, and remains at least partially heated when the heater is switched off thereby reducing the time required to bring the air back to the necessary temperature for melting the solder at the terminals of the component.

BRIEF DESCRIPTION OF THE INVENTION

According to one aspect of the present invention, there is provided a heater device suitable for heating a fluid, typically air, to be contacted with a plurality of terminals of a modular electronic component to facilitate attachment of the component to a substrate such as a printed circuit board, or to facilitate removal of the component from the substrate. The heater device comprises a heat exchange means having at least one passage extending therethrough for heating a fluid flowing through the passage. A heating means is operatively connected to the heat exchange means, and means are also provided in fluid communication with the at least one passage for passing heated fluid from the passage to the terminals of the component to effect melting of solder or the like at the terminals.

In a preferred embodiment, the heater device of the present invention comprises a pair of heat exchange elements each having at least one heated passage through which air to be heated flows, and a respective fluid inlet and fluid outlet in communication with the heated passage to facilitate entry and exiting of the fluid to be heated. The heat exchange elements are disposed adjacent to each other in physical contact with a heater, preferably a stainless steel etched foil heater, so that heat from the heater simultaneously heats both heat exchange elements on either side of the heater. It is preferred to electrically insulate the heat exchange elements from the foil heater, and this may be conveniently achieved by providing a layer of insulating material, such as mica, between the foil heater and each heat exchange element.

In a yet further preferred embodiment, a plenum is provided adjacent each heat exchange element so that air present in the plenum is at least partially heated by the heat exchange elements, and remains at least partially heated when the heater is switched off. In this way, not only is the time reduced for raising the temperature of the air back up to operating temperature, but also the air in each plenum serves to insulate the heat exchange elements from the exterior of the heater device thereby preventing undue increase in temperature in the immediate vicinity of the device.

BRIEF DESCRIPTION OF THE DRAWINGS

The invention of the present application will now be described in more detail with reference to preferred embodiments of the device, given only by way of example, and with reference to the accompanying drawings, in which:

FIG. 3 is a cross-sectional plan elevation taken along the line 3—3 in FIG. 2;

FIG. 5 is a cross-sectional side elevation taken along the line 5—5 in FIG. 2;

FIG. 10 is a partial cross-sectiontal side elevation taken along the line 10—10 shown in FIG. 3.

DETAILED DESCRIPTION OF THE INVENTION

In the following description, reference will be made to air as the fluid being heated. However, it will be appreciated that the invention is not limited to the use of air and other fluids such as inert gases, including nitrogen, oxygen and carbon dixiode, can equally well be used.

Figure 1:
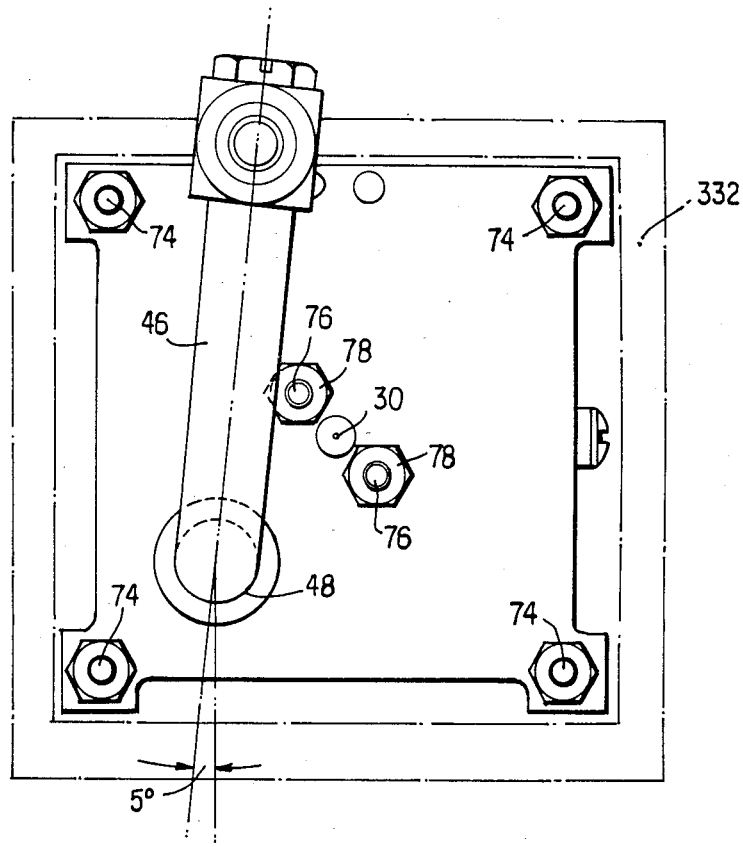
FIG. 1 is a plan view of the heater device of the invention
Figure 2:
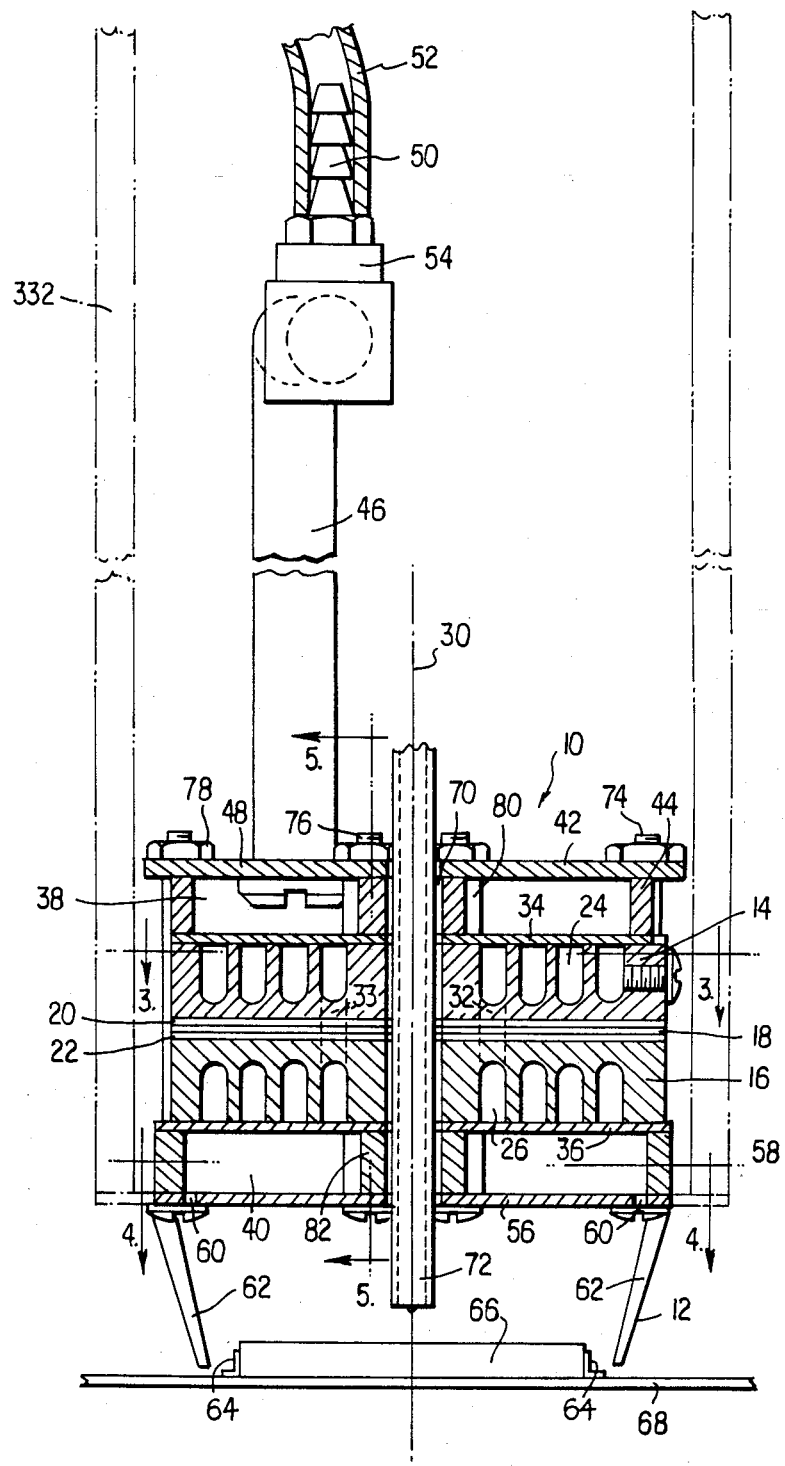
FIG. 2 is a cross-sectional side elevation taken along the line 2—2 in FIG. 1.

Referring now to the drawings, and in particular to FIGS. 1 and 2, there is shown a heater device, generally referenced 10, attached to a tapered nozzle 12. The heater device 10 comprises two heat exchange elements 14, 16, with a heater 18 disposed between the elements. The heater 18 is preferably a stainless steel etched foil heater, and is preferably electrically insulated from the heat exchange elements 14, 16 by insulating layers 20, 22 suitably mica layers. In this, way, heat generated by the foil heater 18 is transmitted through the insulating layers 20, 22 into the heat exchange elements 14, 16 to effect conduction heating of the heat exchange elements.

Each heat exchange element 14, 16 is of low mass and is formed of metal, e.g. bronze or tellurium-copper alloy. Each element has formed therein at least one passageway 24, 26 which, in the embodiment illustrated in FIG. 3, is U-shaped in cross-section and has the appearance of a maze extending from an outer peripheral point 28 along an extended path about a central axis 30 of the element towards an inner point 32. In the embodiments illustrated in FIGS. 1 through 3, each heat exchange element 14, 16 is approximately square in configuration, and each passageway 24, 26 extends in a direction parallel to the four sides of the element about the central axis 30 towards the inner point 32. The inner and outer points 28, 32 define ports through which fluid may enter or exit the passageways 4, 16 and this is described in more detail below in connection with the operation of the heater device.

Referring again to FIG. 2, each heat exchange element 14, 16 is provided with a cover plate 34, 36 which extends over the respective passageways 24, 26. The purpose of these cover plates is to seal the respective passageways 24, 26 to prevent leakage of air being heated in the passageway.

The heater device 10 also comprises a plenum 38 adjacent the heat exchange element 14 and a further plenum 40 adjacent the heat exchange element 16. The plenum 38 is defined by a top plate 42 which is spaced from the cover plate 34 by a spacer member 44 which extends around the periphery of the cover plate 34. A delivery tube 46 is mounted in an aperture 48 in the top plate 42, and air to be heated in the heater device is delivered to plenum 38 through the delivery tube 46. Delivery tube 46 is provided with a standard hose fitting 50 to facilitate attachment of a flexible air delivery hose 52. The hose fitting 50 is mounted to the delivery tube 46 by any convenient means, such as a hexagonal nut assembly 54 as shown in FIG. 1.

Figure 4:
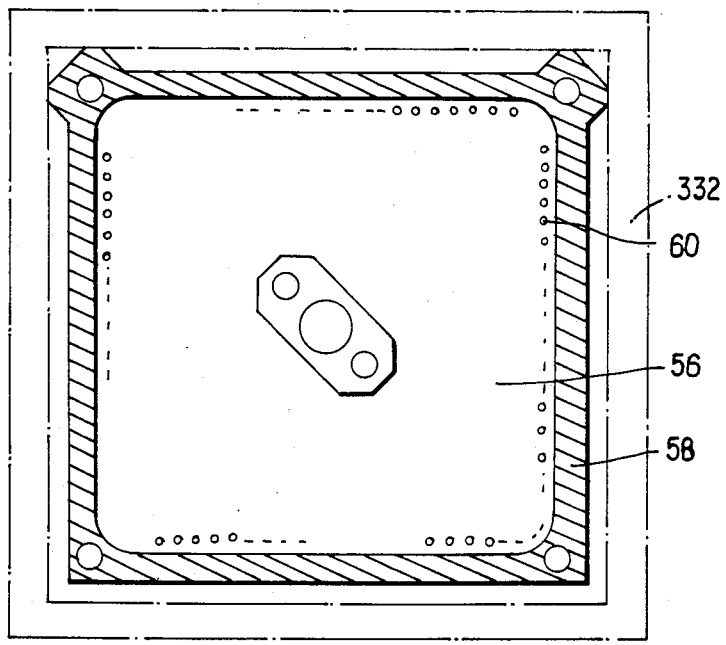
FIG. 4 is a cross-sectional plan elevation taken along the line 4—4 in FIG. 2.

Referring to the plenum 40, this is defined by a an orifice plate 56 which is spaced from the cover plate 36 by a spacer member 58 extending around the periphery of the cover plate 36. The orifice plate 56 is provided with a plurality of orifices 60 extending around the periphery of the orifice plate as shown in FIG. 4 for directing heated air from the plenum 40 along inner surface 62 of the nozzle 12 towards terminals 64 of component 66 mounted on substrate 68.

As will be seen from FIG. 2, the heat exchange elements 14, 16, the insulating layers 20, 22, the heater 18, and the plates 42 and 56 are each configured with a central aperture so that when assembled as shown in FIG. 2, the central apertures form an extended central aperture 70 for receiving a vacuum conduit 72 connected to a source of vacuum (not shown). The purpose of the vacuum conduit 72 is to facilitate removal of the component 56 from the substrate 68 after melting of the solder associated with the terminals 64.

The heater device 10 is maintained in its assembled state as shown in FIG. 2 by bolts 74 located at each of the corners of the device, and by two further bolts 76 disposed on either side of the central axis 30. As shown in FIG. 5, the bolts 76 extend through apertures formed in the plates 42 and 56, as well as the cover plates 34, 36, elements 14 and 15, insulating layers 20 and 22 and heater 18. The assembly is tightened together by means of nuts 78 and, in order to prevent inward flexing of the plates 42, 56 upon tightening of the nuts 78, further spacer elements 80, 82 are provided as shown in FIGS. 2 and 5.

Figure 6:
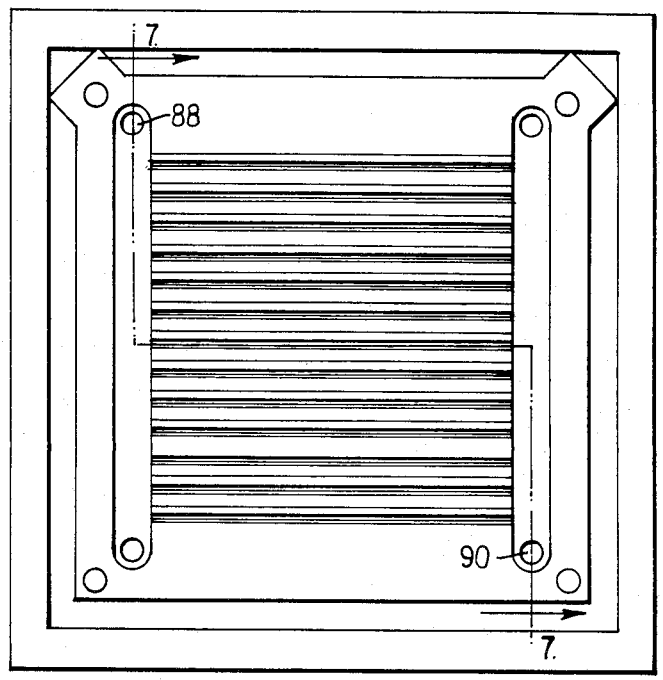
FIG. 6 is a plan view of an alternative heat exchange element.
Figure 7:
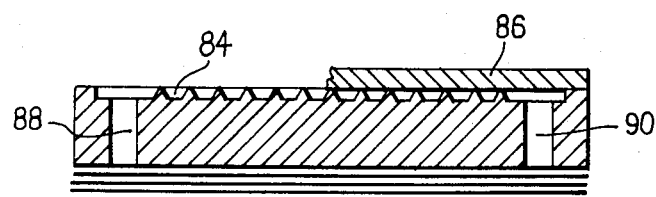
FIG. 7 is a side elevation of the heat exchange element shown in FIG. 6.
Figure 8:
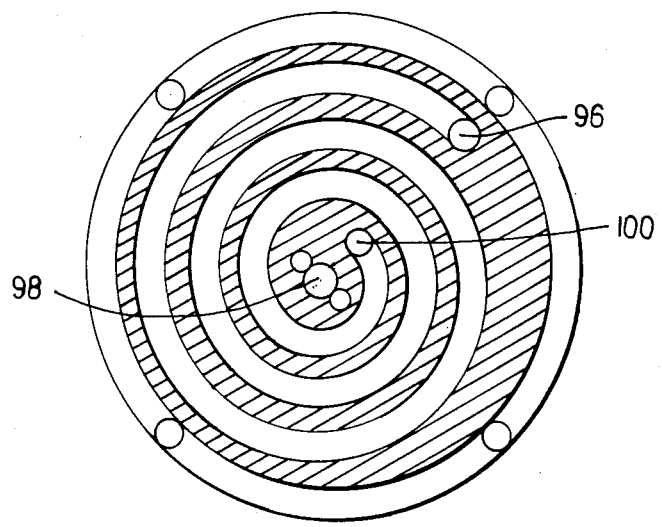
FIG. 8 is a plan view of an alternative configuration for a heat exchange element.

In the embodiment illustrated in FIGS. 1 through 5, the heat exchange elements have an essentially square configuration as shown in FIG. 3 with the passageways 24, 26 extending in parallel with the sides continuously about the central axis 30 from the outer peripheral point 28 to the inner point 32. However, it will be appreciated that this particular configuration of passageway is a preferred embodiment, and any suitable passageway configuration may be utilized which achieves the desired temperature increase of the air to be heated prior to being directed towards the terminals of the component. FIGS. 6 through 8 illustrate alternative embodiments for passageway configurations, and these form a further aspect of the present invention. Referring to the embodiment illustrated in FIG. 6, a series of channels or serrations 84 is provided extending in parallel across each heat exchange element 14, 16. As shown in FIG. 7, each serration 84 is trapezoidal in shape with the shorter parallel side of the trapezium forming the base of the channel. The serrations are sealed by a cover plate 86, and air to be heated is admitted to the serrations by inlet ports 88. The air is heated by passing along and in contact with the serrations 84 and then exits through the exit ports 90.

FIG. 8 shows a further embodiment wherein each heat exchange element 14, 16 has a circular configuration in which a passageway 92 extends from an outer port 96 helically inwardly about a central axis 98 towards an inner port 100.

Figure 9:
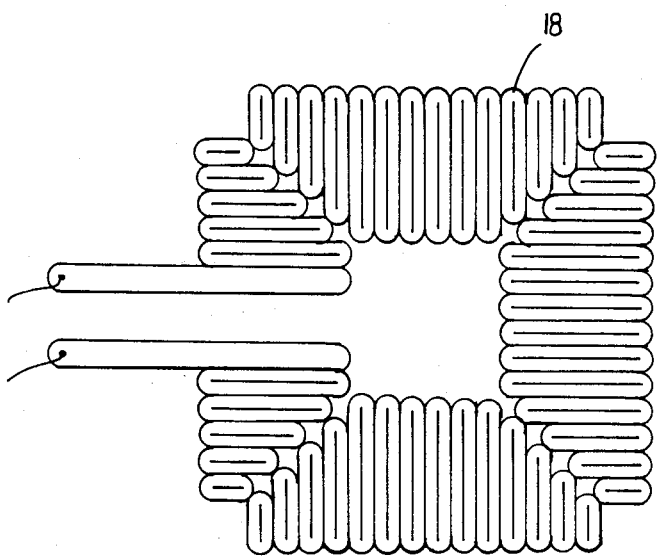
FIG. 9 is a plan view of a stainless steel etched foil heater suitable for use in the heated device of the present invention.

FIG. 9 illustrates a preferred form of heater 18 used in the heating device of the present application, namely an etched or stamped foil heater. While the heater may be fabricated from a number of different suitable materials e.g. tungsten, it is preferably fabricated from a strip of stainless steel formed in a serpentine configuration, and provided with terminals 102 for connection to a source of electricity (not shown).

The heater 18 generally operates at a temperature of about 850° to 1000° F. usually about 900° F., and this causes the temperature of the heat exchange elements to be reduced to about 800° to 900° F., typically about 850° F. As indicated earlier, the elements are of low mass, and so can be quickly raised to operating temperature for example over a period of about 3 minutes, or less. When the temperature of the heat exchange elements is in the range of 800° to 900° F., this results in the temperature of the air being directed towards the terminals of the component being in the region of about 400° F. to 800° F. depending on the flow rate of the air through the heat exchange elements. The melting point of solder is about 380° to 400° F., and it has been found that it is usually necessary to bring the heated air to a temperature of about 50° to 100° F. higher than the solder melt temperature to achieve a satisfactory rate of solder melting without causing undue heat damage to the component or the substrate. This can be achieved quickly and economically by the improved heater device of the present invention due to the low mass of the heat exchange elements and the presence of a plenum adjacent each heat exchange element which prevents significant temperature loss of the air in the plenum when the heater is switched off.

The heater device of the present invention may be assembled in order to facilitate two different modes of operation which are distinguished by the flow path of the air to be heated through the heat exchange elements One mode of operation is where the heat exchange elements are connected for "serial" flow of air, and the other mode of operation is where the heat exchange elements are connected for "parallel" flow of air. The manner in which these different flows of air is achieved will now be described in detail with reference to the embodiments illustrated in FIGS. 1 through 5. However, it is to be understood that the alternative embodiments described above with respect to FIGS. 6 through 9 can also be utilized for either mode of air flow.

With respect to the serial mode of operation, the heat exchange elements 14, 16 are connected so that air to be heated first passes through heat exchange element 14 and then through heat exchange element 16. Thus, referring to FIGS. 2 and 3, air from plenum 38 enters passageway 24 via port 28 and flows around the passageway 24 towards exit port 32. The heated air then exits through exit port 32 and enters an entry port 32' in heat exchange element 16 via a nipple 104 as shown in FIG. 10. The heated air then passes along the passageway 26 in heat exchange element 16 and exits through exit port 28' into the plenum 40. Thus, it can be seen that for "serial" flow, a single stream of air passes first through one heat exchange element and then through the other prior to exiting into the plenum 40.

In the parallel flow mode of operation, one stream of air flows through one of the heat exchange elements and is not subjected to further heating by passing through the second heat exchange element, and another stream of air to be heated is passed through the second heat exchange element without being subjected to further heating by passing through the first heat exchange element. Thus, referring to FIG. 2, in the parallel mode of operation, air to be heated enters the entry port 28 and leaves the passageway 24 through an exit port 33 directly into the plenum 40. In this configuration, the nipple 104 would be blocked so that heated air passes directly from the passageway 24 into the plenum 40 by a conduit directly connecting the exit port 33 and the plenum 40, without passing through heat exchange element 16. Similarly, a second stream of air is passed through the second heat exchange element 16 and directly into the plenum 40 without passing through the heat exchange element 14 and the combined heated air in the plenum 40 from the two exchange elements 14,16 is then directed towards the terminal 64 through apertures 60.

In the serial mode of operation, in which air to be heated first passes through the first heat exchange element 14 and then through the second heat exchange element 16, it will be appreciated that the air passing from the heat exchange element 14 into the heat exchange element 16 is at a higher temperature than that entering the heat exchange element 14 from the plenum 38, so that the heat exchange element 16 tends to be maintained at a temperature which is higher than that of the heat exchange element 14. This temperature differential does not arise in the parallel mode of operation since the air entering the two heat exchange elements is at the same temperature.

The heater device of the present invention enjoys numerous advantages over heater arrangements previously employed in the area of installation and removal of components. In particular, the presence of a plenum in intimate contact with the heat exchange elements, especially the heat exchange element 16, insures that the air does not suffer a significant reduction in temperature when the heater is turned off, for example between component removal or installation operations. In prior devices, when the heater is turned off, the air in the lower chamber cools during such "idle" time since it is not in contact with a heat exchange element, and this means that a longer period of time is required for the air to again reach solder melting temperature when the heater is switched on. With the heater device of the present invention, the time required to raise the temperature of the air in the heater device to solder melting temperature is substantially reduced since it has been maintained at an elevated temperature by virtue of contact with the heat exchange elements. A further advantage arising from the presence of plenum 38 and plenum 40 is that the presence of air in those plenums serves to insulate the heat exchange elements from the exterior of the device, and thereby the temperature in the immediate vicinity of the heater device is maintained at a lower level.

While the heater device of the present invention may be used with any apparatus which is designed for installation or removal of components from printed circuit boards, the present heater device is principally designed for use in in connection with the heater apparatus described and claimed in co-pending application Ser. No. 649,065 filed Sept. 10, 1984, now U.S. Pat. No. 4,659,004 the entire disclosure of which is hereby specifically incorporated by reference. In particular, referring to FIG. 17 of that co-pending application, it will be appreciated that casing 332 in FIG. 17 corresponds to casing 332 in FIG. 2 of the present application, and the heater device 10 of the present application may be mounted at the lower end of casing 332, together with nozzle 12, to provide an improved air heating and delivery means for that apparatus.

In FIG. 2, the heater device 10 of the present invention is shown with the heat exchange elements 14, 16 disposed horizontally with respect to the substrate 68. However, it will be appreciated that it is not critical that the heater device be arranged in this way, and it is equally possible for the heat exchange elements to be disposed vertically as shown ih FIG. 11.

A yet further advantage which is enjoyed by the heater device of the present invention is that the heater 18 serves to heat the heat exchange elements 14, 16 which in turn heat air flowing through the elements. Thus, at no time does the heater 18 come into direct contact with the air being heated, and this prevents, or substantially minimizes, oxidation and corrosion problems arising with respect to the heater as a result of air flowing in contact with the heater. Thus, the heater is substantially protected from air oxidation, and this reduces the number of times it is necessary to dismantle the heating apparatus to replace the heater. The use of heat exchangers for heating the air also results in the production and delivery of more uniformly heated air in contrast to air heated by blowing over at the surface of a heated filament which produces non-uniformly heated air. In addition, the heat exchange element can be produced with a low mass so that they have improved heat capacity properties while at the same time not giving rise to increased temperature conditions due to radiation in the immediate vicinity of the heater device.

We claim:

1. A heater device suitable for heating a fluid to be contacted with a plurality of terminals of a modular electronic component to facilitate attachment of said component to a substrate or removal therefrom, said heater device comprising:

heat exchange means having at least one passage extending therethrough for heating a fluid flowing through said pasasge, said heat exchange means comprising a first and second heat exchange element, each said heat exchange element having at least one passage through which fluid to be heated passes, a fluid inlet means for admitting fluid to be heated into said passage, and a fluid outlet means for passing heated fluid out of said heated passage;

heating means operatively connected to said heat exchange means for heating said heat exchange means, said heating means comprising an electrically operated stainless steel etched foil heater disposed between said first and second heat exchange elements, whereby fluid passing through said first and second elements does not come into physical contact with said foil heater, said foil heater being disposed between insulatiang layers for electrically insulating said foil heater from said first and second heat exchange elements, said foil heater being disposed so as to cover an area which substantially coresponds to an area covered by said heated passages of said first and second heat exchange elements; and means in flow communication with said at least one passage for passing heated fluid from said at least one passage and for directing said fluid to said terminals of said component on said substrate to effect melting of solder or the like at said terminals.

2. A heater device according to claim 2, wherein each said element has a square configuration with four sides and said heated passage in each heat exchange element extends from an outer peripheral point of said element about a central axis of said element parallel to said four sides of said element towards said central axis of said element.

3. A heater device according to claim 2, wherein each said element has a circular configuration and said heat passage in each heat exchange element extends from an outer peripheral point of said element helically inwardly about a central axis of said element towards said central axis of said element.

4. A heater according to claim 2, wherein said at least one heated passage in each said heat exchange element comprises a series of channels disposed parallel to one another and extending across a surface of each said heat exchange elements.

5. A heater device according to claim 4, wherein each of said channels is trapezoidal in cross-section with the shorter parallel side of the trapezium forming a base of the channel.

6. A heater device according to claim 2, wherein said first and second heat exchange elements are connected for serial flow of fluid therethrough, in which a fluid outlet means of said first element is connected to a fluid inlet means of said second element, so that fluid passing through said first element exits through said fluid outlet means of said first element and passes into said second element through said inlet means of said second element.

7. A heater device according to claim 2, wherein said first and second heat exchange elements are connected for parallel flow of fluid therethrough, in which a fluid outlet means of said first element causes fluid heated by passage through said first element to flow directly towards said terminals of said component and a fluid outlet means of said second element causes fluid heated by said second element to flow directly towards said terminals of said component, with said fluid heated by said first element not passing through said second element and said fluid heated by said second element not passing through said first element.

8. A heater device according to claim 1, wherein said heating means is an electrically operated stainless steel etched foil heater.

9. A heater device according to claim 1, wherein plenum means are provided adjacent said heat exchange means for providing a body of fluid adjacent said heat exchange means, said body of fluid being at least partially heated in said plenum means by said heat exchange means, said body of fluid in said plenum means at least partially insulating said heat exchange means from the exterior of the heater device.

10. A heater device according to claim 2, wherein a first plenum is provided adjacent said first heat exchange element, and a second plenum is provided adjacent said second heat exchange element, said first plenum having a fluid inlet means for introducing fluid to be heated into said first plenum, and a fluid outlet means connected to said fluid inlet means of said first heat exchange element for admitting fluid from said first plenum into said first heat exchange element, said second plenum having a fluid inlet means for admitting heated fluid from said first and second heat exchange elements into said second plenum, and a fluid outlet means for passing heated fluid out of said second plenum.

11. A heater device according to claim 10, wherein said first plenum is defined by a top plate axially spaced from said first element, and said second plenum is defined by an orifice plate axially spaced from said second element, said fluid outlet means in said second plenum comprising a plurality of orifices disposed about a periphery of said orifice plate for directing heated fluid from said second plenum towards said terminals of said component.

12. A heater device suitable for heating a fluid to be contacted with a plurality of terminals of a modular electronic component to facilitate attachment of said component to a substrate or removal therefrom, said heater device comprising:

heat exchange means having at least one passage extending therethrough for heating a fluid flowing though said passage, said heat exchange means comprising a first and second heat exchange element, each said heat exchange element having at least one passage through which fluid to be heated passes, a fluid inlet means for admitting fluid to be heated into said passage, and a fluid outlet means for passing heated fluid out of said heated passage;

heating means operatively to said heat exchange means for heating said heat exchange means;

means in flow communication with said at least one passage for passing heated fluid from said at least one passage and for directing said fluid to said terminals of said component on said substrate to effect melting of solder or the like at said terminals; and wherein a first plenum is provided adjacent to said first heat exchange element, and a second plenum is provided adjacent said second heat exchange element, said first plenum having a fluid inlet means for introducing fluid to be heated into said first plenum, and a fluid outlet means connected to said fluid inlet means for said first heat exchange for admitting fluid from said first plenum into said first heat exchange element, said second plenum having a fluid inlet means fo admitting heated fluid from said first and second heat exchange elements into said second plenum, and a fluid outlet means for passing heated fluid out of said second plenum.

13. A heater device according to claim 12, wherein said first plenum is defined by a top plate axially spaced from said first element, and said second plenum is defined by an orifice plate axially spaced from said second element, said fluid outlet means in said second plenum comprising a plurality of orifices disposed about a periphery of said orifice plate for directing heated fluid from said second plenum towards said terminals of said compoment.

14. An apparatus for attaching modular electronic components to or removing them from a substrate, said apparatus comprising a heater device suitable for heating a fluid to be contacted with a plurality of terminals of a modular electronic component to facilitate attachment of said component to a substrate or removal therefrom and having:

heat exchange means having at least one passage extending therethrough for heating a fluid flowing through said passage, said heat exchange means comprising a first and second heat exchange element, each said heat exchange element having at least one passage through which fluid to be heated passes, a fluid inlet means for admitting fluid to be heated into said passage, and a fluid outlet means for passing heated fluid out of said heated passage;

heating means operatively connected to said heat exchange means for heating said heat exchange means, said heating means comprising an electrically operated stainless steel etched foil heater disposed between said first and second heat exchange elements, whereby fluid passing through said first and second elements does not come into physical contact with said foil heater, said foil heater being disposed between insulating layers for electrically insulating said foil heater from said first and second heat exchange elements, said foil heater being disposed so as to cover an area which substantially corresponds to an area covered by said heated passages of said first and second heat exchange elements; and means in flow communication with said at least one passage for passing heated fluid from said at least one passage and for directing said fluid to said terminals of said component on said substrate to effect melting of solder or the like at said terminals.

* * * * *